United States Patent
Clark et al.

(10) Patent No.: US 11,250,189 B1
(45) Date of Patent: Feb. 15, 2022

(54) IDENTIFYING EFFECTS OF GEOMETRIC VARIATIONS OF PHYSICAL PARTS

(71) Applicant: Government of the United States, as represented by the Secretary of the Air Force, Wright-Patterson AFB, OH (US)

(72) Inventors: John Clark, Oakwood, OH (US); Joseph Beck, Minneapolis, MN (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 321 days.

(21) Appl. No.: 16/351,799

(22) Filed: Mar. 13, 2019

Related U.S. Application Data

(60) Provisional application No. 62/664,693, filed on Apr. 30, 2018.

(51) Int. Cl.
*G06F 30/23* (2020.01)
*F01D 5/16* (2006.01)
*F01D 5/26* (2006.01)
*F01D 25/06* (2006.01)

(Continued)

(52) U.S. Cl.
CPC ............. *G06F 30/23* (2020.01); *F01D 5/16* (2013.01); *F01D 5/26* (2013.01); *F01D 25/06* (2013.01); *F16F 15/005* (2013.01); *G06F 30/28* (2020.01)

(58) Field of Classification Search
CPC ........ G06F 30/23; G06F 30/28; G06F 30/367; G06F 30/25; G06F 30/398; G06F 2111/00; G06F 2119/22; G06F 30/20; F01D 25/06; F01D 5/26; F01D 5/16; F16F 15/005
See application file for complete search history.

(56) References Cited

U.S. PATENT DOCUMENTS 8,006,544 B2   8/2011  Holmes et al.
2008/0275677 A1* 11/2008  Landon .................. G06F 30/23
                                                 703/2

(Continued)

OTHER PUBLICATIONS

Alshroof, el al. "Computational Fluid Dynamic Analysis of a Vibrating Turbine Blade," International Journal of Rotating w Machinery, vol. 2012, Article ID 246031, doi: 10.1155/2012/246031 Retrieved from https://www.hindawi.com/journals/ijrm/2012/246031/abs/ (Year: 2012).*

(Continued)

*Primary Examiner* — Steven W Crabb
(74) *Attorney, Agent, or Firm* — AFMCLO/JAZ; Matthew D. Fair

(57) ABSTRACT

Identifying effects of geometric variations of physical parts may include measuring one or more surfaces of a physical part in three-dimensions, analyzing measurements of the physical part to determine a geometric variation from a baseline model, modifying an existing computational fluid dynamics (CFD) mesh for the baseline model based on the geometric variation using a mesh metamorphosis algorithm to create a target mesh for the physical part, and analyzing the target mesh using a CFD analysis to determine an effect (e.g., an effect on unsteadiness) in a system caused by the geometric variation.

15 Claims, 10 Drawing Sheets

(51) Int. Cl.
F16F 15/00 (2006.01)
G06F 30/28 (2020.01)

(56) References Cited

U.S. PATENT DOCUMENTS

2014/0112760 A1* 4/2014 Duong .................. F01D 9/04
                                                    415/119
2016/0246917 A1* 8/2016 Otsmane ............ G06F 30/00

OTHER PUBLICATIONS

Biesinger et al., "Unsteady CFD Methods in a Commercial Solver for Turbomachinery Applications," Proceedings of ASME Turbo Expo 2010: Power for Land, Sea and Air GT2010, pp. 1-12 (Year: 2010).*
Muhammad Afzaal Asghar et al., "Investigation of Unsteady Flow Interactions in a Transonic High Pressure Turbine Using Nonlinear Harmonic Method," Energies Journal 11, 342 published Feb. 2, 2018, retrieved online from mdpi.com Mar. 23, 2021 (Year: 2018).*
Sharma, O. P., Pickett, G. F., and Ni, R. H., 1992, "Assessment of Unsteady Flows in Turbines," ASME J. Turbomach., 114(1), pp. 79-90.
Paniagua, G. and Denos, R., 2007, "Unsteadiness in HP Turbines," in Advances in Turbomachinery Aero-Thermo-Mechanical Design Analysis, VKI Lecture Series Feb. 2007.
Kielb JJ, Abhari RS. Experimental Study of Aerodynamic and Structural Damping in a Full-Scale Rotating Turbine. ASME. J. Eng. Gas Turbines Power. 2002;125(1):102-112.
Carassale L, Marrè-Brunenghi M, Patrone S. Estimation of Damping for Turbine Blades in Non-Stationary Working Conditions. ASME. Turbo Expo: Power for Land, Sea, and Air, vol. 7B: Structures and Dynamics ():V07BT32A018, 2015.
Meinzer CE, Bittner SL, Schmitt S, Kielb RE, Seume JR. Design of a Single Stage Turbine for the Quantification of Aerodynamic Damping. ASME. Turbo Expo: Power for Land, Sea, and Air, vol. 7B: Structures and Dynamics (): V07BT34A004., 2015.
Jennions, I. K. and Adamczyk, J. J., 1997, "Evaluation of the Interaction Losses in a Transonic Turbine HP Rotor / LP Mane Configuration," ASME J. Turbomach., vol. 119, pp. 68-75.
Clark JP, Aggarwala AS, Velonis MA, Gacek RE, Magge SS, Price FR. Using CFD to Reduce Resonant Stresses on a Single-Stage, High-Pressure Turbine Blade. ASME. Turbo Expo: Power for Land, Sea, and Air, vol. 4: Turbo Expo 2002, Parts A and B ():845-851.
Dunn, M. G., 2001, "Convective Heat Transfer and Aerodynamics in Axial Flow Turbines," ASME J. Turbomach., vol. 123, pp. 637-686.
Adamczyk, J. J., 2000, "Aerodynamic Analysis of Multi-Stage Turbomachinery Flows in Support of Aerodynamic Design," ASME J. Turbomach , vol. 122, pp. 189-217.
Lewalle, J., 1994, "Wavelet Analysis of Experimental Data: Some Methods and the Underlying Physics," Fluid Dynamics Conference Colorado Springs,CO, 1994, AIAA Paper No. 94-2281.
Clark, J. P., Koch, P. J., Ooten, M. K., Johnson, J. J., Dagg, J., McQuilling, M. W., Huber, F., and Johnson, P. D., 2009, "Design of Turbine Components to Answer Research Questions in Unsteady Aerodynamics and Heat Transfer," WPAFB, OH, 45433, AFRL Report No. AFRL-RZ-WP-TR-2009-2180.
Clark, J. P., 2012, "Design Strategies to Mitigate Unsteady Forcing," in Structural Design of Aircraft Engines: Key Dbjectives and Techniques, ed. G. Paniagua, NATO Research and Technology Office AVT 207, VKI Lecture Series Jun. 2012, January.
Hancock, B. J. and Clark, J. P., 2014, "Reducing Shock Interactions in Transonic Turbine via Three-Dimensional Aerodynamic Shaping," AIAA J. of Propulsion and Power, vol. 30, No. 5, pp. 1248-1256.
Davis, R. L. and Clark, J. P., 2014, "Geometry/Grid Generation for 3D Multi-Disciplinary Simulations in Multi-Stage Turbomachinery," AIAA J. of Propulsion and Power, vol. 30, No. 6, pp. 1502-1509.

Davis, R. L., Dannenhoffer, J. F., and Clark, J. P., 2011, "Conjugate Design/Analysis Procedure for Film-Cooled Turbine Airfoil Sections," AIAA J. of Propulsion and Power, vol. 27, No. 1, pp. 61-70.
Ni R, Humber W, Ni M, Capece VR, Ooten M, Clark J. Aerodynamic Damping Predictions for Oscillating Airfoils in Cascades Using Moving Meshes. ASME. Turbo Expo: Power for Land, Sea, and Air, vol. 7B: Structures and Dynamics ():V07BT34A012, 2016.
Gottleib, J., Davis, R. L., and Clark, J. P., 2013, "Simulation Strategy for Film-Cooled Multistage Turbine Design and Analysis," AIAA J. of Propulsion and Power, vol. 29, pp. 1495-1498.
Garzon, V. E., 2002, "Probabilistic Aerothermal Design of Compressor Airfoils," PhD Thesis, MIT, Cambridge, MA.
Goodhand MN, Miller RJ, Lung HW. The Sensitivity of 2D Compressor Incidence Range to In-Service Geometric Variation. ASME. Turbo Expo: Power for Land, Sea, and Air, vol. 8: Turbomachinery, Parts A, B, and C ():159-170, 2012.
Goodhand, M. N. and Miller, R. J., 2012, "The Impact of Real Geometries on Three-Dimensional Separation in Compressors," ASME J. Turbomach., vol. 134, pp. 021007-1:8.
Lange, A., Voigt, M., Vogeler, K., Schrapp, H., Johann, E., and Gummer, V., 2011, "Impact of Manufacturing Variability and Nonaxisymmetry on High-Pressure Compressor Stage Performance," ASME J. Eng. Gas Turbines Power, 143(3), p. 032504.
Garzon, V. E. and Darmofal, D. L., 2003, "Impact of Geometric Variability on Axial Compressor Performance," ASME J. Turbomach., 125(4), pp. 692-703.
Bammert, K., and Sandstede, H., 1976, "Influences of Manufacturing Tolerances and Surface Roughness of Blades on the Performance of Turbines," ASME J. of Eng. for Power, vol. 98, pp. 29-36.
Andersson, S., 2007, "A Study of Tolerance Impact on Performance of a Supersonic Turbine," 43rd AIAA/ASME/SAE/ASEE Joint Propulsion Conference & Exhibit Cincinnati, OH, Jul. 8-11, 2007.
Reitz G, Schlange S, Friedrichs J. Design of Experiments and Numerical Simulation of Deteriorated High Pressure Compressor Airfoils. ASME. Turbo Expo: Power for Land, Sea, and Air, vol. 2A: Turbomachinery ():V02AT37A002, 2016.
Dow, E. A. and Wang, Q., 2015, "The Implications of Tolerance Optimization on Compressor Blade Design," ASME J. Turbomach., vol. 137, pp. 10100801:7.
Buske C, Krumme A, Schmidt T, Dresbach C, Zur S, Tiefers R. Distributed Multidisciplinary Optimization of a Turbine Blade Regarding Performance, Reliability and Castability. ASME. Turbo Expo: Power for Land, Sea, and Air, vol. 2C: Turbomachinery ():V02CT45A002.,2016.
Marcu, B., Tran, K., and Wright, B., 2002, "Prediction of Unsteady Loads and Analysis of Flow Changes Due to Turbine Blade Manufacturing Variations During the Development of Turbines for the MD-XX Advanced Upper Stage Engine," 38th AIAA/ASME/SAE/ASEE Joint Propulsion Conference & Exhibit Indianapolis, Indiana.
Schnell, R., Lengyel-Kampmann, T., Nicke, E., 2013, "On the Impact of Geometric Variability on Fan Aerodynamic Performance, Unsteady Blade Row Interaction, and Its Mechanical Characteristics," ASME J. Turbomach., 136(9), pp. 091005-1:14.
Holtzhausen S, Schreiber SS, Schöne Ch, Stelzer RR, Heinze KK, Lange AA. Highly Accurate Automated 3D Measuring and Data Conditioning for Turbine and Compressor Blades. ASME. Turbo Expo: Power for Land, Sea, and Air, vol. 6: Structures and Dynamics, Parts A and B ():37-41, 2009.
Kaszynski AA, Beck JA, Brown JM. Uncertainties of an Automated Optical 3D Geometry Measurement, Modeling, and Analysis Process for Mistuned Integrally Bladed Rotor Reverse Engineering. ASME. J. Eng. Gas Turbines Power. 2013; 135(10):102504-102504-8.
Kaszynski AA, Beck JA, Brown JM. Automated Finite Element Model Mesh Updating Scheme Applicable to Mistuning Analysis. ASME. Turbo Expo: Power for Land, Sea, and Air, vol. 7B: Structures and Dynamics ():V07BT33A025, 2014.
Kaszynski AA, Beck JA, Brown JM. Experimental Validation of a Mesh Quality Optimized Morphed Geometric Mistuning Model. ASME. Turbo Expo: Power for Land, Sea, and Air, vol. 7A: Structures and Dynamics (): V07AT27A005, 2015.

(56) References Cited

OTHER PUBLICATIONS

Anthony RJ, Clark JP. A Review of the AFRL Turbine Research Facility. ASME. Turbo Expo: Power for Land, Sea, and Air, vol. 3C: Heat Transfer ():V03CT14A010, 2013.

Dunn, M. G. and Haldeman, C. W., Jr., 1995, "Phase-Resolved Surface Pressure and Heat Transfer Measurements on the Blade of a Two-Stage Turbine," ASME J of Fluids Eng., vol. 117, pp. 653-658.

Beck, J. A., Brown, J. M., Cross, C. J., and Slater, J. C., 2014, "Component-Mode Reduced-Order Models for Geometric Mistuning of Integrally Bladed Rotors," AIAA Journal, vol. 52, pp. 1345-1356.

\* cited by examiner

IDENTIFYING EFFECTS OF GEOMETRIC VARIATIONS OF PHYSICAL PARTS

CROSS-REFERENCE TO RELATED APPLICATIONS

This application claims the benefit of U.S. Provisional Application No. 62/664,693 filed on Apr. 30, 2018, the entire content of which is hereby incorporated by reference.

STATEMENT OF GOVERNMENT INTEREST

The invention described herein may be manufactured, used, and licensed by or for the Government of the United States for all governmental purposes without the payment of any royalty.

BACKGROUND

Unsteadiness effects of physical parts is an area of ongoing concern, such as unsteady aerodynamics in turbomachines where the forced response vibration that can arise from unsteadiness may result in significant increases in product development costs. Unsteady forcing can also give rise to decreased component lives resulting in both increased maintenance and sustainment costs. Designers may attempt to reduce resonant stresses in turbomachinery through structural changes that are meant to move critical modes out of engine operating ranges, where such structural changes can include changes in airfoil shape, thickness, and count. However, these practices can result in suboptimal designs that have degraded performance, increased weight, and life-cycle cost growth. Accordingly, damping technologies may be utilized to reduce the magnitude of resonant stresses, and there have also been attempts to mitigate the severity of unsteady forcing itself through aerodynamic design. However, any attempt to reduce unsteady forcing through aerodynamic design may itself be predicated on the notion that unsteadiness is predictable to an acceptable level of accuracy, but this can be a difficult proposition given complicated flowfields consistent with turbine aerodynamics.

By way of example, the unsteady flowfield in a single-stage, high-work, high-pressure turbine that is paired with a contra-rotating low-pressure turbine may be dominated by shock interactions. Initial testing with such a turbine may indicate that the overall physics of shock interaction with a downstream vane is well predicted, and this can give credence to efforts to reduce the unsteadiness via three-dimensional unsteady optimization. However, there may be significant discrepancies between predicted levels of unsteadiness (e.g., on the blade suction side due to shock reflections from the downstream vane) and those measured in experiments.

Discrepancies between predicted levels of unsteadiness and those measured in experiments may arise from uncertainties in physical part geometry modeled in a predictive system. Accordingly, there remains a need for improved techniques to identify the effects of physical parts caused by geometric variations (e.g., between an actual physical part and a blueprint model), and to use this information to improve the design or manufacturing of the physical part and/or a system utilizing the physical part.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. The drawings are not necessarily to scale, emphasis instead being placed upon illustrating the principles of the devices, systems, and methods described herein. In these drawings, like reference numerals may identify corresponding elements.

DETAILED DESCRIPTION

Figure 1:
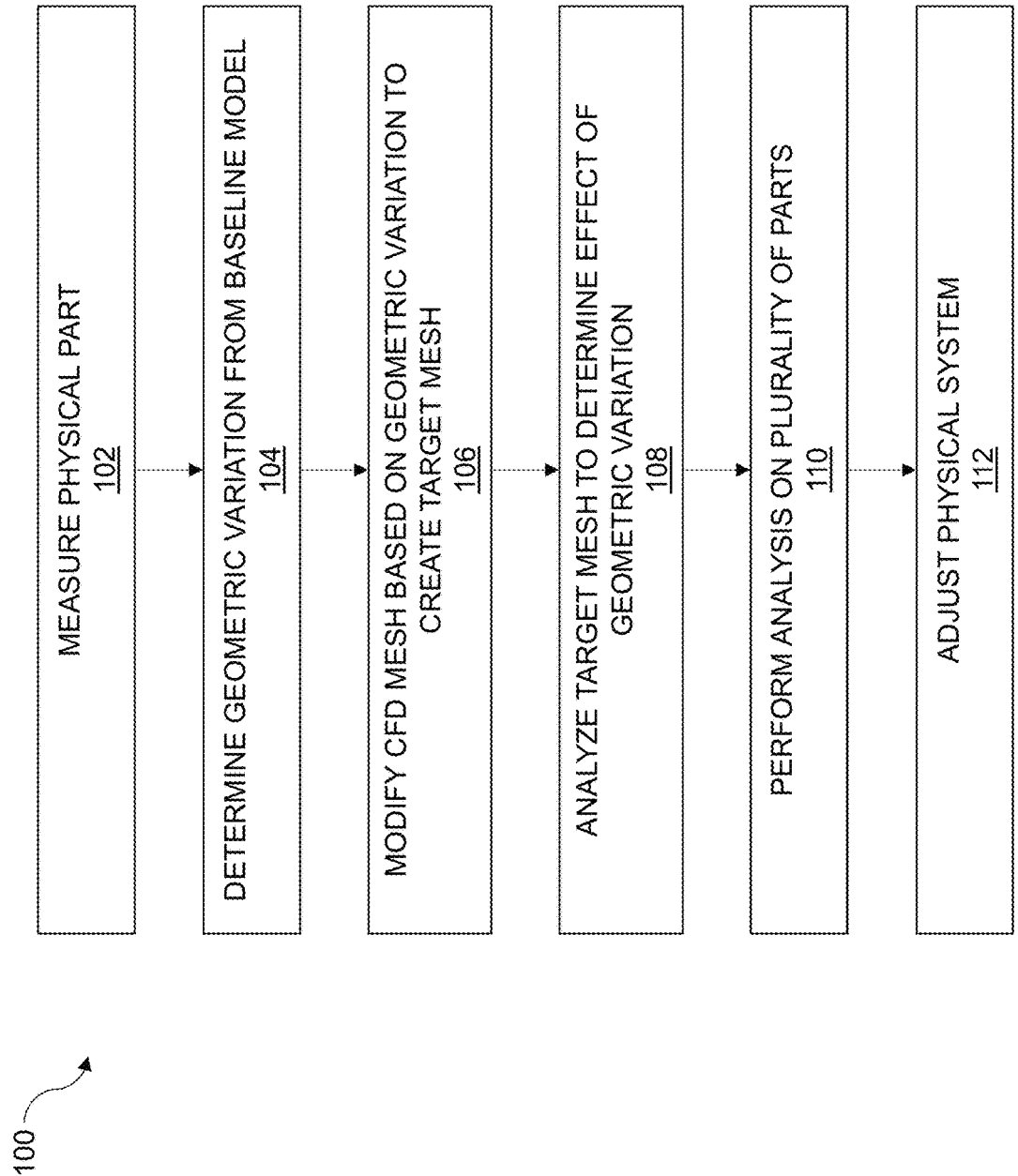
FIG. 1 is a flow chart of a method for identifying an effect of a physical part caused by a geometric variation, in accordance with a representative embodiment.

The various methods, systems, apparatuses, and devices described herein generally relate to identifying effects of physical parts caused by geometric variations thereof, and using knowledge of the identified effects to improve designs of physical parts and systems, as well as the manufacturing of same.

While this invention is susceptible of being embodied in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

In general, the devices, systems, and methods described herein may include identifying effects of physical parts (e.g., unsteadiness effects) caused by a geometric variation thereof (e.g., from a baseline or blueprint model), such as a physical part of a turbine, e.g., a turbine blade. It will be understood, however, that although this disclosure may emphasize physical parts embodied as a component of a turbine, the techniques disclosed herein may also or instead be used with other physical parts. Thus, it will be understood that any reference to a "turbine" or a "turbine blade" is generally provided by way of example, and could also or instead include another, different physical part unless explicitly stated to the contrary or otherwise clear from the context. Similarly, it will be understood that any reference to a "physical part" may include a physical component of a turbine, or other physical components (similar or otherwise) such as a fan, a compressor airfoil, or any component that moves or is related to fluid flow relative to another component.

Turning back to an exemplary embodiment of turbine blades, the present teachings may be used in the context of turbines because components of a turbine may experience undesirable or unacceptable levels of stress. For example, unsteady aerodynamics in turbomachines may give rise to forced response vibrations that can result in Class A mishaps. If a Class A mishap occurs, or if unacceptable resonant stresses are measured during engine developmental testing, then product life-cycle costs can rise dramatically, where a costly re-design is often required. Designers may attempt to reduce resonant stresses in turbomachinery through structural changes that are meant to move critical modes out of engine operating ranges, and this can include changes in airfoil shape, thickness, and count. These practices can result in suboptimal designs that have degraded performance, increased weight, and life-cycle cost growth. These shortcomings may be overcome using the present teachings, which can be used to reduce resonant stress on a turbine blade through the use of full-surface geometric measurements and computational fluid dynamics analysis to create improved mechanical systems, such as a turbine blade row that has relatively low-stress components.

In this manner, an implementation of the present teachings includes a reduced forcing turbine blade, as well as techniques to reduce resonant stress on a turbine blade. As such, techniques described herein may include the use of full-surface measurements of as-built turbine airfoil shapes combined with computational fluid dynamics analysis to obtain an advantageous distribution of turbine blades around a turbine disk, e.g., a distribution or design that minimizes or mitigates blade stress. The disclosed teachings may thus be preferable to state-of-the-art solutions that can involve costly redesigns. That is, a state-of-the-art solution to a resonant stress problem may rely on the redesign of components from either a structural or aerodynamic perspective (sometimes both) to achieve acceptable levels of stress, which can be detrimental to development costs. However, using the present teachings, existing castings or other tooling for an existing design may be used in conjunction with measurements and analysis techniques to determine an acceptable or otherwise advantageous configuration for physical parts such as turbine blades.

In general, the disclosed techniques may include a measurement system (e.g., an optical scanner) used to obtain geometric measurements for a physical part such as cast turbine blades. The resulting as-measured geometries may then be analyzed using computational fluid dynamics techniques to predict a level of unsteady forcing of a physical part, e.g., unsteady forcing that each turbine blade may experience in a turbine wheel. In some implementations, the prediction may include modeling the same turbine blade throughout a turbine wheel, i.e., where the turbine wheel includes turbine blades having the same geometric measurements. In this manner, a variation in levels of unsteadiness resulting from each individual blade may be obtained. Also, or instead, a set of airfoils that are predicted to induce relatively low levels of unsteadiness may be placed in proximity to a target turbine blade to demonstrate that such positioning may result in low forcing at the target blade. In this manner, the present teachings have shown that it is possible to tailor the unsteadiness experienced by each turbine blade around a turbine wheel to maintain an acceptable level of resonant stress for each turbine blade.

Thus, implementations may be used to tailor the level of resonant stress to which an airfoil is subjected by careful placement of low-unsteadiness producing airfoils in its immediate vicinity. These techniques may be used to construct turbine wheels that do not fail due to high-cycle fatigue by applying suitable measurements and analyses to available turbine geometries from a manufacturing run of turbine blades.

Techniques may include measuring all available embodiments of turbine blades in three dimensions. Then, each airfoil may be analyzed with a computational fluid dynamics code to predict the level of unsteadiness arising on each turbine blade. This may result in a variation in levels of predicted unsteadiness on the turbine blade that varies due to the underlying geometric differences in the turbine blades. Next, a statistical analysis on the predicted variation of unsteadiness may be performed to select a number of neighboring turbine blades that reduce the unsteadiness on a target airfoil (or a number of target airfoils), and the selected airfoils may be placed in proximity to the target airfoil(s) around the turbine wheel. This may result in a turbine blade that experiences reduced unsteadiness, and therefore, reduced resonant stress.

FIG. 1 is a flow chart of a method 100 for identifying an effect of a physical part caused by a geometric variation thereof, in accordance with a representative embodiment. As stated above, the physical part may include any one of a variety of physical parts, such as one or more blades of a turbine or other components that are structurally configured to be arranged in a physical system. Additionally, the unsteadiness effect identified by the method 100, or by other techniques described herein, may include any identifiable effect that the method 100 uncovers through the various analyses described herein.

As shown in block 102, the method 100 may include measuring one or more surfaces of a physical part in three-dimensions. This may include the use of an optical scanner to measure one or more surfaces of a physical part, e.g., a blue light optical scanner. Measuring one or more surfaces of a physical part in three-dimensions may also or instead include the use of a structured light optical measurement system, and/or the use of a coordinate measurement machine (CMM).

All surfaces of the physical part may be measured in the method 100. For example, a complete exterior surface of the physical part may be measured. In some implementations, at least a portion of an interior surface of a physical part may also or instead be measured in three-dimensions, such as where the physical part is structurally configured to have fluid flow within an interior of one or more portions of the physical part.

As shown in block 104, the method 100 may include analyzing measurements of the physical part to determine a geometric variation from a baseline model. In certain implementations, the baseline model corresponds to a manufacturer specification or blueprint for the physical part. Also, or instead, the baseline model may correspond to a model derived from a second physical part, e.g., where the second physical part was previously measured in the method 100 or in another process.

Analyzing measurements of the physical part to determine a geometric variation from a baseline model may include a one-to-one comparison of one or more as-measured surfaces or features of the physical part to the same or similar surfaces or features on the baseline model to establish a delta.

As shown in block 106, the method 100 may include modifying an existing computational fluid dynamics (CFD) mesh for the baseline model based on the geometric variation (e.g., determined in block 104) to create a target mesh for the physical part. This may be accomplished using a mesh metamorphosis algorithm. In general, any mesh metamorphosis algorithm available in the art, and known to skilled artisans, can be used in the method 100 and techniques described herein.

In certain implementations, modifying the existing CFD mesh includes iteratively updating the existing CFD mesh using the mesh metamorphosis algorithm to create the target mesh. Modifying the existing CFD mesh may also or instead include the use of point-cloud techniques. Modifying the existing CFD mesh may also or instead include updating nodes using an iterative spring analogy to avoid grid corruption. For example, the nodes that are updated using the iterative spring analogy may include nodes interior to a surface in the existing CFD mesh, which can help to avoid the aforementioned grid corruption.

As shown in block 108, the method 100 may include analyzing the target mesh (e.g., created in block 106) using a CFD analysis to determine an effect (e.g., an effect on unsteadiness) in a system caused by the geometric variation of the physical part. The CFD analysis may include one or more of a time-domain analysis and a frequency-domain analysis. The CFD analysis may also or instead include an analysis of surface pressure traces. For example, the effect on unsteadiness may be based on one or more of surface pressure and shear stress experienced by the target mesh in the CFD analysis.

In certain implementations, the CFD analysis includes use of a Reynolds-Averaged Navier-Stokes flow solver with a two-equation Wilcox turbulence model. However, it will be understood that any means of analysis would be acceptable, particularly if the analysis produced distributions in unsteady pressure and/or shear stress over the physical part, which again may include an airfoil. Thus, the CFD analysis may generally include the use of a CFD solver having an output including one or more of time-varying pressure and shear stress on a physical part. This can be a Reynolds-Averaged Navier-Stokes (RANS) flow solver with a two-equation Wilcox turbulence model as stated above, or a non-RANS-based solver in certain implementations.

The method 100 may be performed on one or more physical parts. Thus, as shown in block 110, the method 100 may include performing an analysis on a plurality of parts including the physical part to determine an arrangement of the plurality of parts in a physical system. The analysis on the plurality of physical parts may include a statistical analysis.

As shown in block 112, the method 100 may include adjusting an arrangement of a physical system containing the physical part to reduce the effect that was identified through the aforementioned analyses (e.g., an effect on unsteadiness). For example, when an effect on unsteadiness is above a predetermined threshold, the method 100 may include adjusting an arrangement of a physical system containing the physical part to reduce unsteadiness. Adjusting the arrangement of the physical system may reduce resonant stress in the physical system. For example, if the physical part is a blade of a turbine, adjusting the arrangement of the physical system may include moving the blade within the turbine to reduce resonant stress experienced in the turbine. In such instances, moving the blade within the turbine may include rearranging a plurality of blades within the turbine. Thus, in certain implementations, each blade of a turbine may be measured and analyzed according to the method 100 to identify an unsteadiness effect (or other characteristic of interest) for each specific turbine blade, and then the arrangement and configuration of the turbine as a whole can be adjusted (or designed, or redesigned) based on the findings in the method 100. In this manner, the actual, physical geometries of the physical parts, and the fluid flow effects of these geometries, can be used for a more intelligent design of a system that includes one or more of the physical parts. In certain implementations, the acceptability of physical parts can be determined based on the minimum (or maximum) values obtained for all physical parts that are measured and analyzed. However, various means of statistical analysis and/or design optimization could be used to find acceptable configurations. For example, in some turbomachines, the airfoil row (or rows) offset with respect to the target airfoil may be measured, analyzed, and distributed around the turbine wheel to lower the stress on target airfoils.

Having described a general method 100 according to the present teachings, a system or apparatus according to implementations of the present teachings will now be described.

Figure 2:
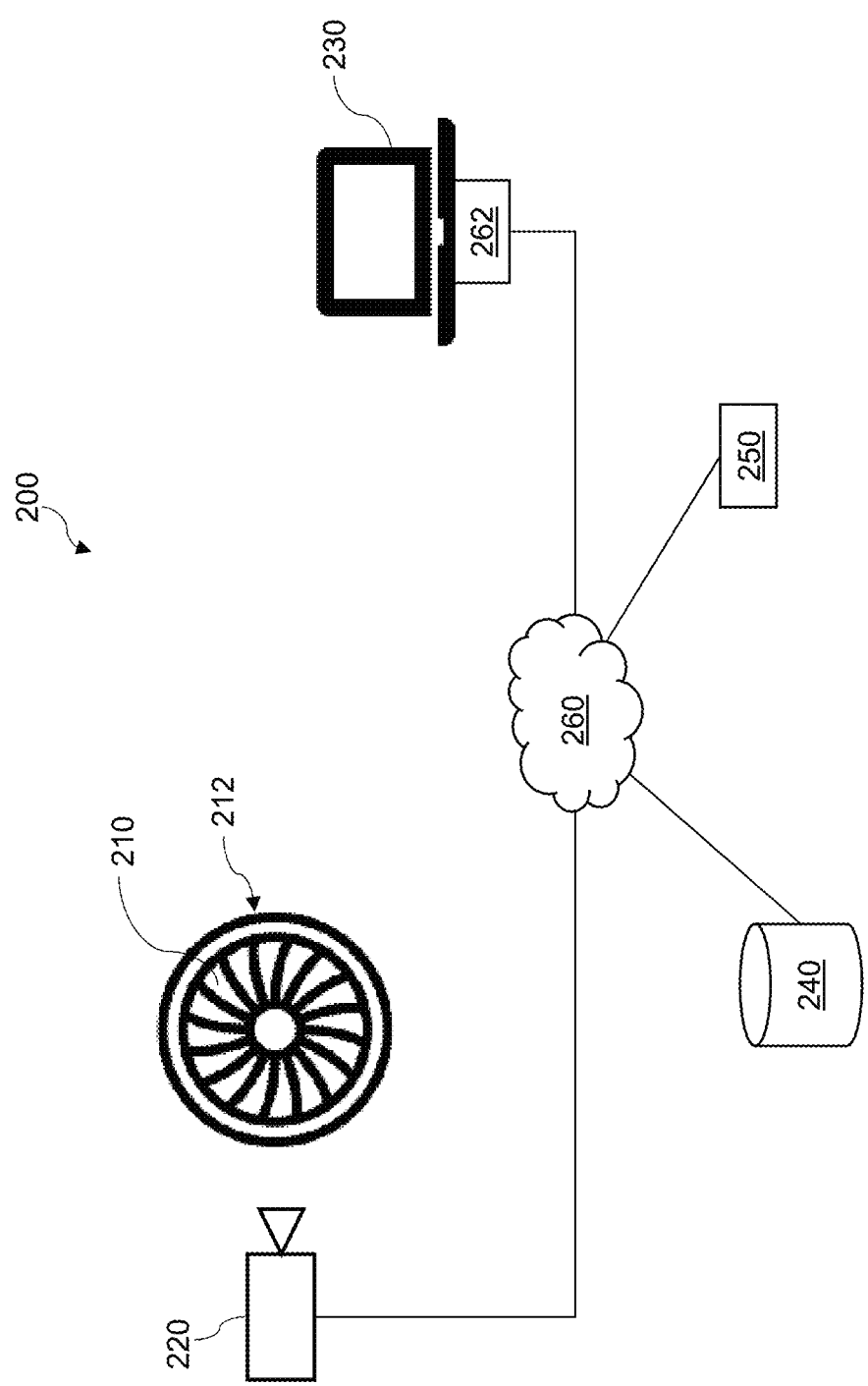
FIG. 2 illustrates a system for analysis of a physical part, in accordance with a representative embodiment.

FIG. 2 illustrates a system 200 for analysis of a physical part 210, in accordance with a representative embodiment. The system 200 may thus include one or more physical parts 210 structurally configured to be arranged in a physical apparatus 212, a measurement system 220, a computing device 230, an external resource 240, and other hardware 250. One or more of the foregoing components of the system 200 may be interconnected in a communicating relationship via a data network 260 using one or more communications interfaces 262.

As shown in FIG. 2, and as discussed herein, the physical part 210 may be one of a plurality of physical parts 210 arranged in a physical apparatus 212, such as where the physical part 210 is a turbine blade that is arranged in a physical apparatus 212 such as a turbine. That is, each of the plurality of physical parts 210 may include a blade of a turbine, and the arrangement of the plurality of physical parts 210 in the predetermined manner may include a predetermined positioning within the turbine for each of the blades.

Thus, using the techniques described herein, the plurality of physical parts 210 may be arranged in a predetermined manner based on an unsteadiness effect (which can be measured in the physical world or modeled in a computational or simulated environment), or another characteristic of interest deduced through techniques described herein, corresponding to at least one physical part 210 of the plurality of physical parts 210. And more specifically, the arrangement of the plurality of physical parts 210 in the predetermined manner may be based on an unsteadiness effect, or another effect of interest deduced through techniques described herein, for each physical part 210 in the plurality of physical parts 210. For example, the plurality of physical parts 210 may be arranged in a predetermined manner based on an unsteadiness effect established by measuring a surface of the physical part 210 in three-dimensions using the measurement system 220, analyzing measurements of the physical part 210 to determine a geometric variation from a baseline model, modifying an existing CFD mesh for the baseline model based on the geometric variation using a mesh metamorphosis algorithm to create a target mesh for the physical part 210, and analyzing the target mesh using a CFD analysis to determine the unsteadiness effect caused by the geometric variation.

The measurement system 220 may include any as described herein such as an optical scanning system including an optical scanner, e.g., a structured light optical measurement system, or a coordinate measurement machine (CMM) or system. The scanner may include a handheld scanner configured to capture a three-dimensional scan of a surface of an object (e.g., a surface feature of an object). The measurement system 220 may also or instead include a laser-line scanner or the like that is structurally configured to acquire three-dimensional data using one or more of structured light, modulated light, shape from motion, range finding, radiation, ultrasound, contact scanning, volumetric techniques, or any other suitable technique for acquiring a three-dimensional digital surface representation from a physical object, i.e., the physical part 210. The measurement system 220 may include any hardware or software (or it may be in communication with a device including such hardware and software) that enables it to capture a three-dimensional scan or measurement of a surface feature of a physical part 210 in addition to, or in lieu of, capturing the general, aggregate three-dimensional shape of the physical part 210. In other words, in an aspect, the surface feature may be captured independent of an aggregate geometry, or alternatively, the surface feature may be isolated from the aggregate three-dimensional shape of the physical part 210 after scanning or measuring.

The computing device 230 may include a processor and a memory, e.g., where the processor implements instructions contained on the memory for performing one or more of the techniques or analyses described herein. In general, the computing device 230 may be electrically coupled in a communicating relationship, e.g., an electronic communication, with any of the components of the system 200. In some implementations, the computing device 230 may be operable to control the components of the system 200, such as the measurement system 220. To this end, the computing device 230 may include any combination of software and/or processing circuitry suitable for controlling the various components of the system 200 described herein including without limitation processors, microprocessors, microcontrollers, application-specific integrated circuits, programmable gate arrays, and any other digital and/or analog components, as well as combinations of the foregoing, along with inputs and outputs for transceiving control signals, drive signals, power signals, sensor signals, and the like. In certain implementations, the computing device 230 may include processing circuitry with sufficient computational power to provide related functions such as executing an operating system, running one or more algorithms, providing a graphical user interface, setting and providing rules and instructions for operation of a component of the system 200, operating a web server or otherwise hosting remote operators and/or activity through a communications interface 262, and so on. The computing device 230 may thus include any devices within the system 200 operated by operators or otherwise to manage, monitor, communicate with, control, or otherwise interact with other participants or components in the system 200. This may include desktop computers, laptop computers, network computers, tablets, smartphones, or any other device that can participate in the system 200 as contemplated herein. In an implementation, the computing device 230 is integral with another participant in the system 200.

The external resource 240 may include a server, a database or other data storage, a network interface, a processor or other processing circuitry, and the like. The external resource 240 may also or instead include a web server that provides web-based access by one or more components of the system 200 to the capabilities of the server, e.g., including any of the processing capabilities or algorithms described herein. The external resource 240 may thus include a blade server, a server computer, an application server, a database server, a cloud computing resource, and the like. When the system 200 is implemented as a client server architecture, the server may manage the connections and interactions with each component of the system 200, generate code (e.g., HTML code) to send to each component of the system 200, receive data from each component of the system 200, and the like. The external resource 240 may be implemented in hardware or software. Non-limiting examples of code include HTML, JavaScript, Python, Java, C++, and the like.

The other hardware 250 may include a camera, a power source, a sensor, a database, and the like. The other hardware 250 may also or instead include input devices such as a keyboard, a touchpad, a computer mouse, a switch, a dial, a button, and the like, as well as output devices such as a display, a speaker or other audio transducer, light emitting diodes or other lighting or display components, and the like. Other hardware 250 of system 200 may also or instead include a variety of cable connections and/or hardware adapters for connecting to, e.g., external computers, external hardware, external instrumentation or data acquisition systems, and the like.

The data network 260 may include any network(s) or internetwork(s) suitable for communicating data and control information among participants in the system 200. This may include public networks such as the Internet, private networks, telecommunications networks such as the Public Switched Telephone Network or cellular networks using third generation (e.g., 3G or IMT-2000), fourth generation (e.g., LTE (E-UTRA) or WiMAX-Advanced (IEEE 802.16m) and/or other technologies, as well as any of a variety of corporate area or local area networks and other switches, routers, hubs, gateways, and the like that might be used to carry data among participants in the system 200. The data network 260 may include wired or wireless networks, or any combination thereof. One skilled in the art will also recognize that the components and participants shown the system 200 need not be connected by a data network 260, and thus can be configured to work in conjunction with other participants independent of the data network 260.

Communication over the data network 260, or other communication between components of the system 200, may be provided via one or more communications interfaces 262. The communications interface 262 may include, e.g., a Wi-Fi receiver and transmitter to allow calculations and the like to be performed on a separate computing device 230. More generally, the communications interface 262 may be suited such that any of the components of the system 200 can communicate with one another. Thus, the communications interface 262 may be present on one or more of the components of the system 200. The communications interface 262 may include, or be connected in a communicating relationship with, a network interface or the like. The communications interface 262 may include any combination of hardware and software suitable for coupling the components of the system 200 to a remote device (e.g., a computing device 230 such as a remote computer or the like) in a communicating relationship through a data network 260. By way of example and not limitation, this may include electronics for a wired or wireless Ethernet connection operating according to the IEEE 802.11 standard (or any variation thereof), or any other short or long-range wireless networking components or the like. This may include hardware for short range data communications such as Bluetooth or an infrared transceiver, which may be used to couple into a local area network or the like that is in turn coupled to a data network 260 such as the internet. This may also or instead include hardware/software for a WiMAX connection or a cellular network connection (using, e.g., CDMA, GSM, LTE, or any other suitable protocol or combination of protocols). Additionally, the computing device 230 (or another component of the system 200) may be configured to control participation by the components of the system 200 in any network to which the communications interface 262 is connected, such as by autonomously connecting to the data network 260 to retrieve updates and the like.

Having described a general method 100 and system 200 according to the present teachings, an example technique of the present teachings will now be described. A description of the example below can also be found in Clark, John P., et al., "The Effect of Manufacturing Variations on Unsteady Interaction in a Transonic Turbine," ASME Paper No. GT2017-64075 (2017), which is incorporated by reference herein in its entirety.

In summary, the following example discusses a comparison of unsteadiness due to as-measured turbine blades in a transonic turbine to that obtained with blueprint geometries via computational fluid dynamics (CFD). In the following example, a Reynolds-averaged Navier-Stokes flow solver with the two-equation Wilcox turbulence model is used as the numerical analysis tool for comparison between the blueprint geometries and as-manufactured geometries obtained from a structured light optical measurement system. In this example, the nominal turbine CFD grid data defined for analysis of the blueprint blade was geometrically modified to reflect as-manufactured turbine blades using a mesh metamorphosis algorithm. The following approach may use a modified neural network to iteratively update the source mesh to the target mesh. In this example case, the source is the interior CFD surface grid while the target is the surface blade geometry obtained from an optical scanner. Nodes interior to the CFD surface may be updated using a modified iterative spring analogy to avoid grid corruption when matching as-manufactured part geometry. This approach may avoid a tedious manual approach of regenerating the CFD grid, and does not need to rely on geometry obtained from coordinate measurement machine (CMM) sections, but rather a point cloud representing the entirety of a turbine blade. Surface pressure traces and the discrete Fourier transforms thereof from numerical predictions of as-measured geometries may then be compared both to blueprint predictions and to experimental measurements. Incorporating as-measured geometries in analyses to explain deviations between numerical predictions of blueprint geometries and experimental results may provide many advantages to those in the field. For example, analysis of every casting produced in the creation of a test turbine may yield variations that can be expected in both aero-performance and unsteady loading as a consequence of manufacturing tolerances. Finally, the following example demonstrates the use of measured airfoil geometries to reduce the unsteady load on a target blade in a region of interest.

Before explaining this example, it is useful to note that the unsteady flowfield in a single-stage, high-work, high-pressure turbine that is paired with a contra-rotating low-pressure turbine may be dominated by shock interactions. Testing of a turbine may indicate that the overall physics of the shock interaction with a downstream vane is well predicted, which can give credence to efforts to reduce the unsteadiness via three-dimensional unsteady optimization. However, there may still be significant discrepancies between predicted levels of unsteadiness on the blade suction side due to shock reflections from the downstream vane and those measured in experiments. Accordingly, determining the source of such discrepancies for improvements thereof may be of interest in high-work turbine development.

While it is possible that a substantial portion of the discrepancy arises due to uncertainties in the geometry modeled in the predictive system, the effects of as-measured versus as-intended geometries on the prediction of unsteady shock interactions in the turbine are assessed in the following example. In previous studies, shock interactions that are detected on one blade have been found to be due to trailing-edge shocks that emanate from blades offset by as many as three passages in the circumferential direction. Thus, modeling a substantial portion of the wheel using as-measured blades may be advantageous. That is, single blade calculations using either periodic- or harmonic-balance boundary conditions are unlikely to produce all of the effects detectable in an experiment.

There is existing literature on the effect that geometric perturbations can cause on aerodynamic performance of both compressors and turbines, and engineers are well aware that turbomachinery components degrade over time through the ordinary usage of the engine. Accordingly, techniques that take variability and manufacturing constraints into account during the design and optimization of components may be advantageous.

The following experimental example represents the collection of as-manufactured measurements of structural components to reduce geometric uncertainty, e.g., using approaches for morphing finite-element meshes of nominal geometries to their corresponding as-measured point-cloud data. Specifically, these technologies may be applied to the external geometries for the turbine blades providing "morphed" CFD grids. This can avoid a tedious manual approach of regenerating a CFD grid for each airfoil geometry. Furthermore, techniques need not rely on geometry obtained from CMM sections, but rather can use a point cloud from structured light scanners representing the entirety of a turbine blade. Morphing can ensure that discrepancies between nominal geometry model and an as-manufactured geometry model were due to the geometric perturbations only, and not variations in the meshing process, patterns, and/or densities.

In the following experimental example, a total of 105 airfoils were scanned and morphed into analysis grids for the assessment of geometric variability on shock interactions in a stage-and-one-half transonic turbine. The as-built, instrumented turbine wheel was composed of 46 blades, and there were 59 spare castings. Each blade was analyzed using the Unsteady Reynolds-Averaged Navier-Stokes (URANS) flow solver (described in Ni, R. H., et al., "Aerodynamic Damping Predictions for Oscillating Airfoils in Cascades Using Moving Meshes," ASME Paper No. GT2016-57017 (2016), which is incorporated by reference herein in its entirety) with circumferentially-periodic boundary conditions in a stage-and-one-half simulation employing the Wilcox k-w turbulence model. There were 23 vanes both upstream and downstream of the vane row, so the total simulation was periodic on $\frac{1}{23}$rd of the wheel, and a periodic model included one upstream vane, two blades, and one downstream vane.

Continuing with this example, in addition to the 105 periodic unsteady calculations using individually-measured blades, a full-wheel simulation was conducted using all measured blades that comprised the experimental turbine in its as-built configuration. This calculation included 23 upstream vanes, the 46 as-measured blades, and 23 downstream vanes. This example thus represents an assessment of the effects of measured blades on predicted unsteadiness due to shock interactions with the blade and downstream vane. Because the dominant frequency of interaction with the downstream vanes that was measured at the blade row is twice the fundamental downstream passing frequency (2×23 E=46 E), and the unsteadiness is detected downstream of the blade throat on the suction side, accordingly, the results presented below focus on Discrete Fourier Transform (DFT) magnitudes at 46 E in that region of the airfoil.

Some nomenclature used in this example is as follows: DFT=Discrete Fourier Transform; E=engine order=f/(N/60); f=frequency of unsteadiness (Hz); k=turbulent kinetic energy ($m^2/s^2$); N=blade rotational speed (revolutions per minute); $P_{tin}$=inlet total pressure (kPa); URANS=Unsteady Reynolds-Averaged Navier-Stokes; $\Delta\eta$=percent difference in predicted efficiencies; ω=turbulent dissipation rate (1/s).

Continuing with this example, the CFD morphological process that was used will now be discussed.

Finite element meshes based on as-measured geometry have been built using structured CMM points that are then interpolated and built up into full CFD meshes. An advantage of this approach may include that the structured CMM data is relatively easily restructured and interpolated into a set of data similar to the structured mesh composing a CFD model, making it relatively easy to generate a full mesh. One of the disadvantages with this approach may be that the geometry between sections is approximated, and, in places where it cannot be easily measured (e.g., along the blade tip), it assumes a nominal geometry. The present teachings, however, may employ an approach to generating as-manufactured CFD meshes using full, dense, unstructured surfaces meshes that are collected with structured light scanning systems or the like.

The surface geometry in this example was obtained using an 8-megapixel blue structured light optical scanner with an approximate resolution of 50.8 μm (2 mil) and a proven repeatable accuracy of 7.62 μm (0.3 mil). Each optical scan was then aligned to the same computer-aided design (CAD) that was used for downstream FEM and CFD analysis. Care was taken to weight the alignment of the dovetail and platform when mounting to avoid misaligning blades when accounting for blade shape variability. This ensured that the blades were positioned in the same manner as they would when mounted on a disk, and this was useful when analyzing geometric characteristics like trailing-edge metal angle. Each of these scans was then used to update the geometry of the nominal CFD mesh using a mesh metamorphosis approach that modified the original mesh surface and interior points.

The nominal, as-designed CFD mesh may be based on the original CAD geometry, and may be updated to the as-manufactured geometry by using a process for updating as-designed meshes using machine learning algorithms, where details on the implementation of the algorithm can be found in the following publications, where each of the following is incorporated by reference herein in its entirety: Kaszynski, A. A., et al., "Uncertainties of an Automated Optical 3D Geometry Measurement, Modeling, and Analysis Process for Mistuned Integrally Bladed Rotor Reverse Engineering," ASME J. Eng. Gas Turbines and Power, 135(10), pp. 102504 (2013); Kaszynski, A. A., et al., "Automated Finite Element Model Mesh Updating Scheme Applicable to Mistuning Analysis," ASME Paper No. GT2014-26925 (2014); and Kaszynski, A. A., et al., "Experimental Validation of a Mesh Quality Optimized Morphed Geometric Mistuning Model," ASME Paper No. GT2015-43150 (2015). As the CFD mesh used in this example approximates the as-designed geometry by removing cooling holes, these and other similar features may be removed or ignored when updating the mesh.

Figure 3:
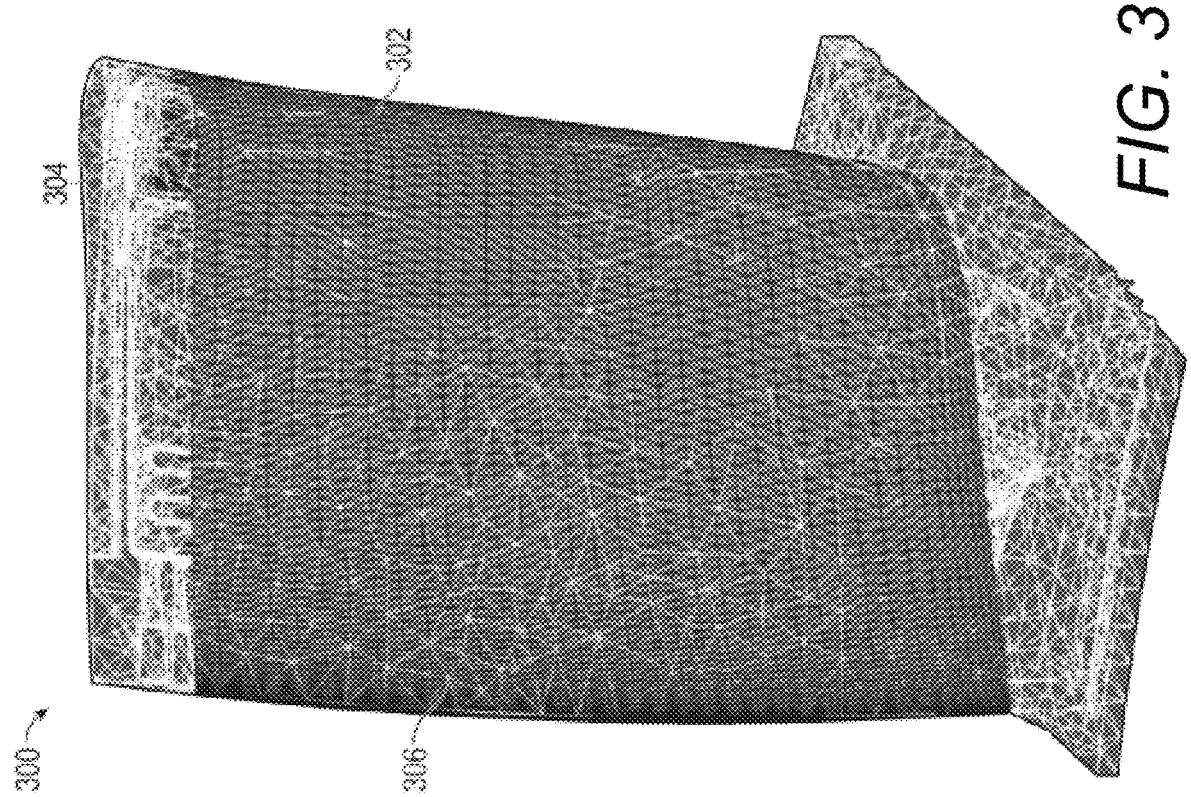
FIG. 3 illustrates an as-measured airfoil morphed computational fluid dynamics (CFD) surface mesh wrapped around a finite element model based on nominal geometries, in accordance with a representative embodiment.
Figure 5:
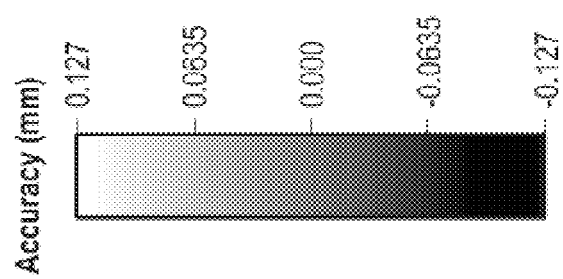
FIG. 5 illustrates quantitative discrepancies found in the surface of the pressure side of an airfoil, in accordance with a representative embodiment.
Figure 5:
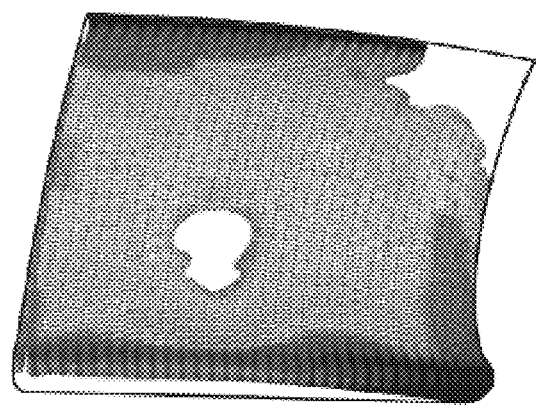
Figure 4:
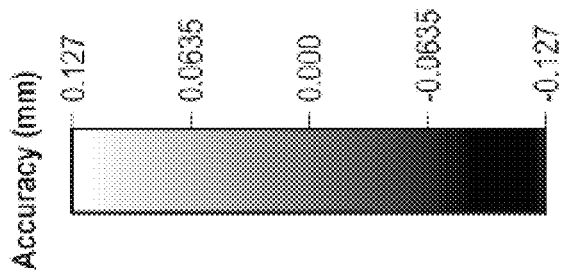
FIG. 4 illustrates quantitative discrepancies found in the surface of the suction side of an airfoil, in accordance with a representative embodiment.
Figure 4:
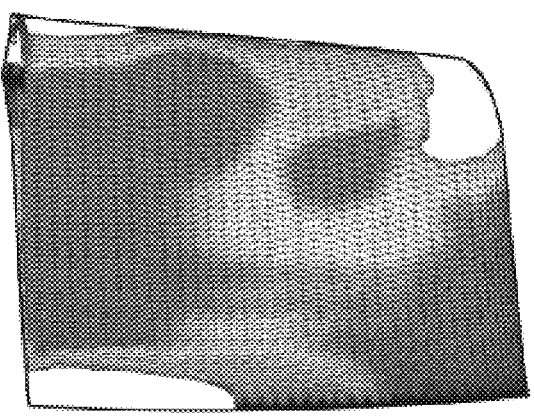

FIG. 3 illustrates an as-measured airfoil morphed CFD surface mesh wrapped around a finite element model based on nominal geometries. Specifically, FIG. 3 shows a model 300 where the CFD surface 302 is shown overlaid onto nominal finite element model mesh 304. In the model 300, qualitative discrepancies 306 between each surface can be discerned where the white finite element grid is masked. Quantitative discrepancies 306 can be computed for the entire surface, where an example of such discrepancies is shown in FIG. 4 and FIG. 5 for the suction and pressure sides, respectively, of a single as-measured airfoil. These figures demonstrate that deviations may exist over the entire airfoil.

From the above, the mean and standard deviation in local surface distance between a blueprint blade and the measured blade geometries may be deduced. In some cases, considerable variation can be seen in the local surface position near the trailing edge of the blade on both the pressure and suction sides of the airfoil. Because the geometry in this region of the airfoil may be critical to the formation of the blade cross-passage shock as well as the reflection of that shock downstream from the blade trailing-edge, it is expected that the variation found in blade surface measurements would result in substantial changes in the predicted level of unsteadiness downstream of the blade throat (since that, in turn, is the area of the blade affected by shock reflections from the downstream vane row).

Figure 6:
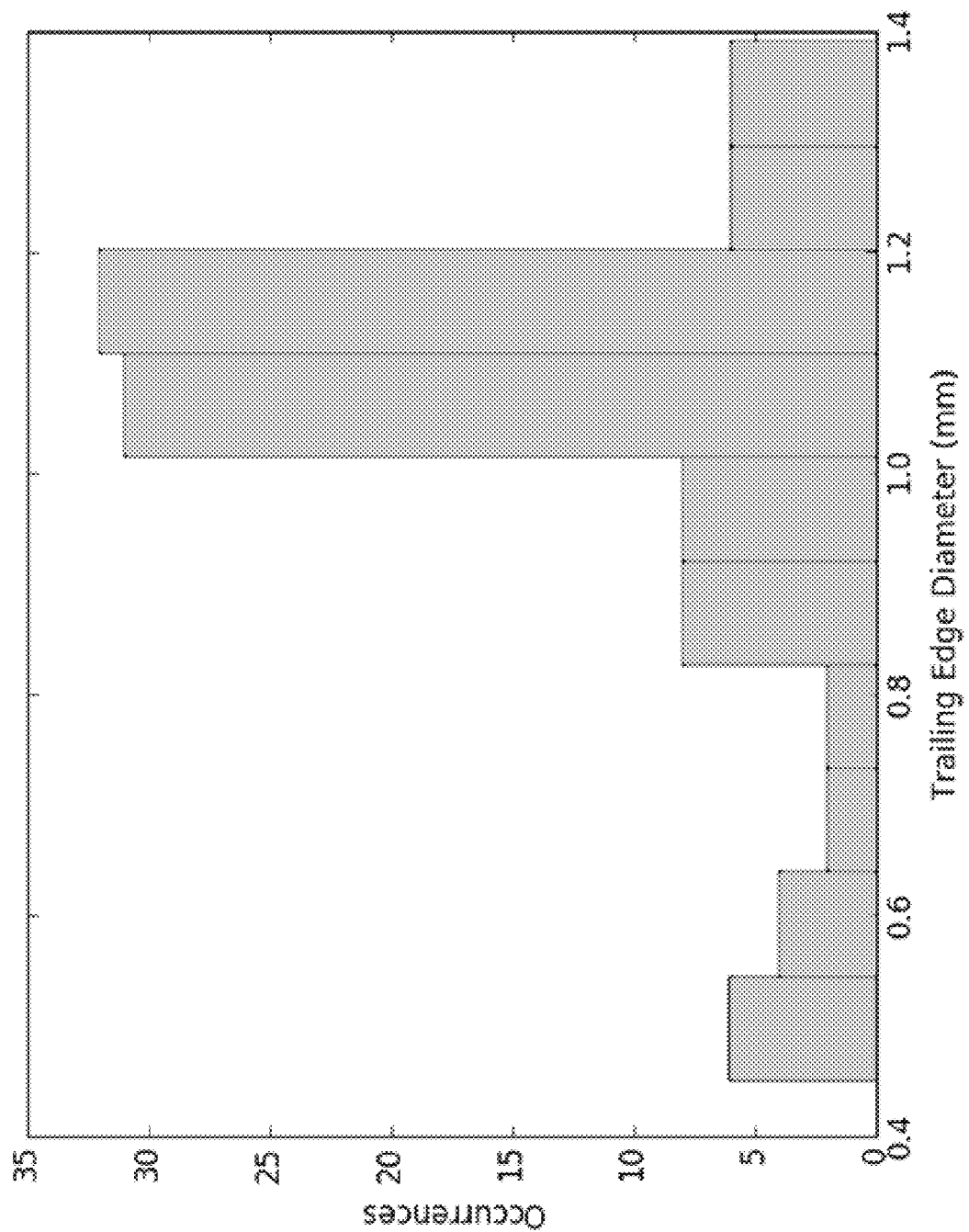
FIG. 6 is a histogram for the airfoil trailing-edge diameter, in accordance with a representative embodiment.
Figure 7:
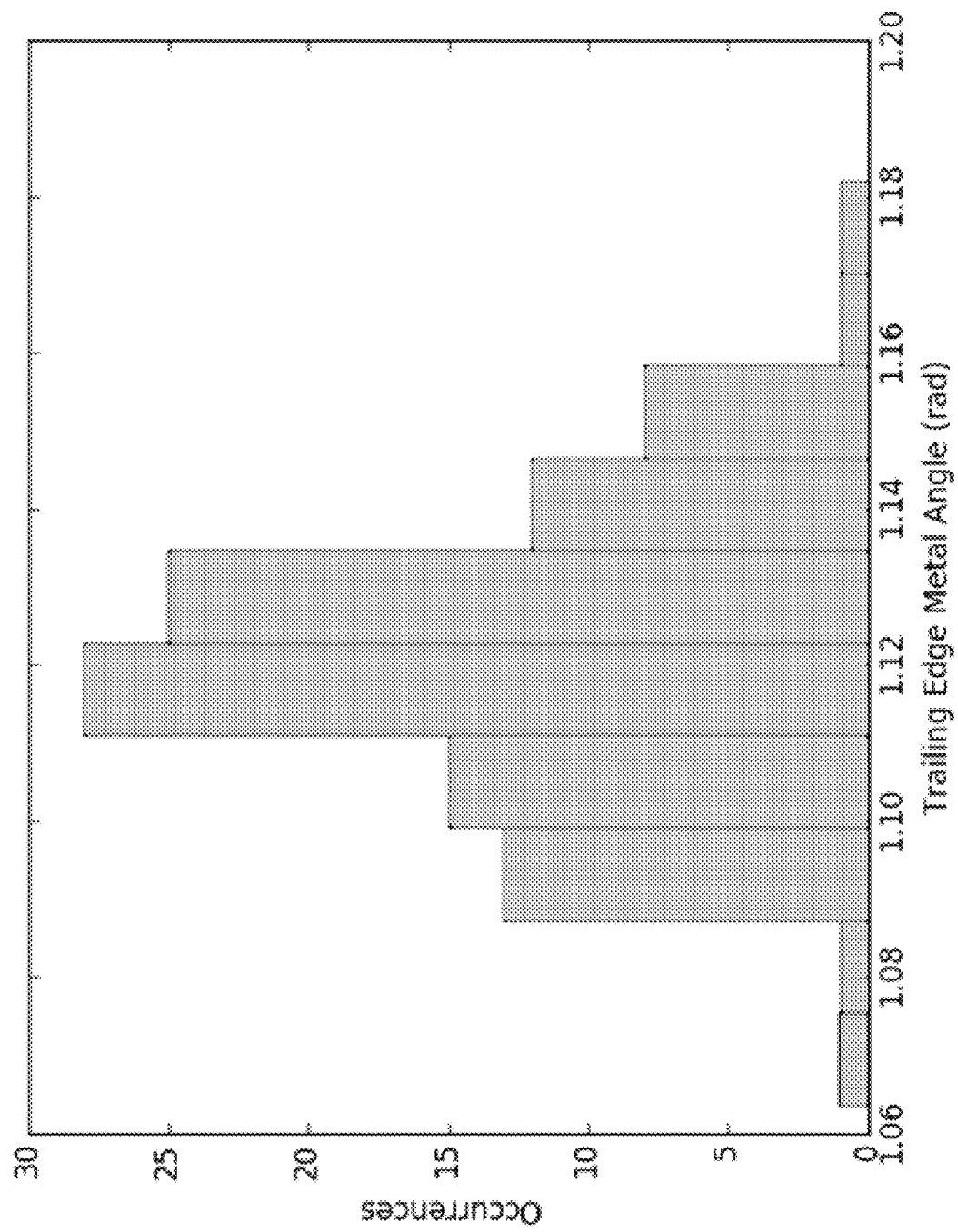
FIG. 7 is a histogram for the airfoil metal angle, in accordance with a representative embodiment.
Figure 8:
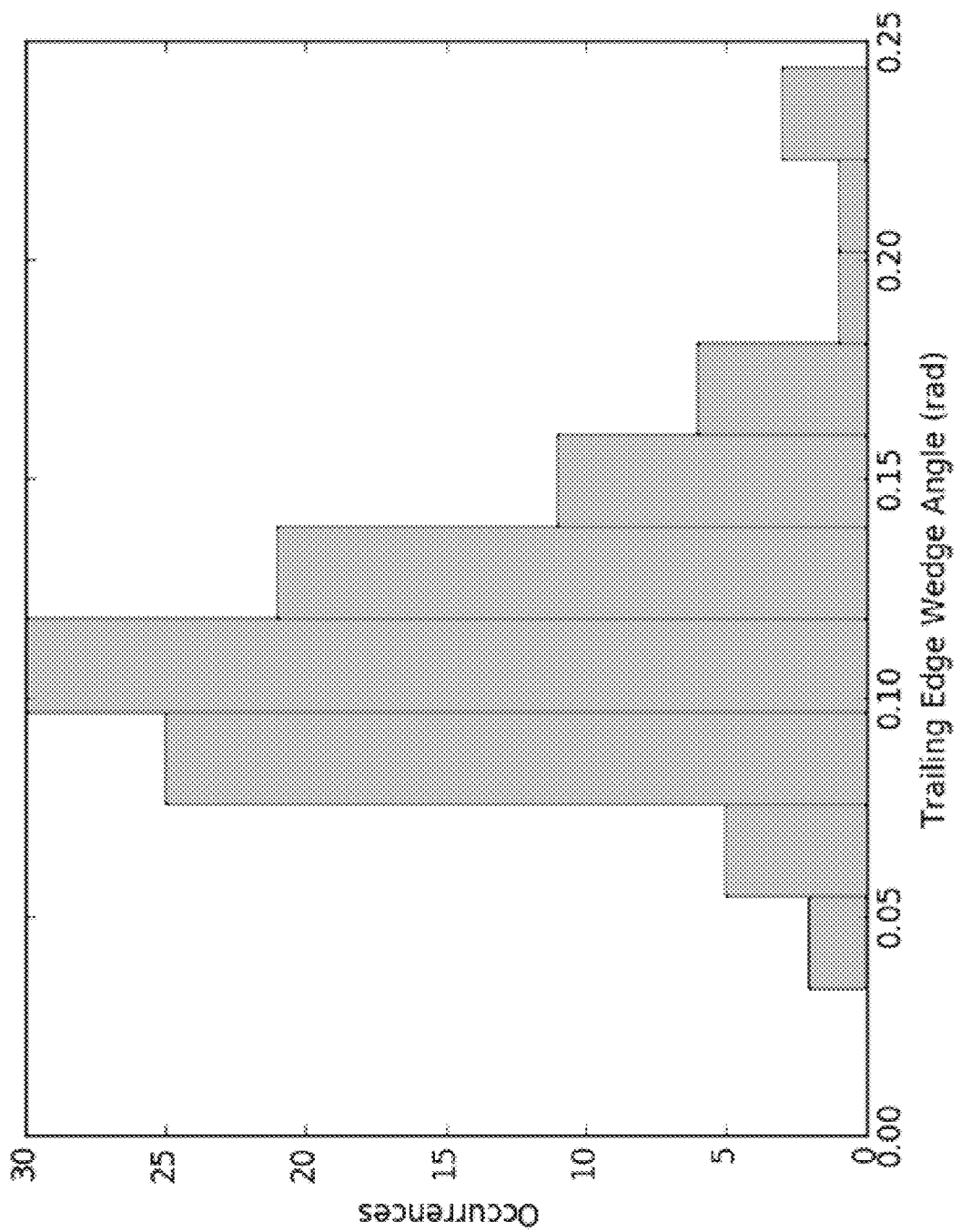
FIG. 8 is a histogram for the airfoil wedge angle, in accordance with a representative embodiment.

Pairing down the three-dimensional deviations to two-dimensional cross-sections may provide a closer view of the discrepancies in the region of the trailing edge, e.g., where the blueprint cross-section may qualitatively fall to the pressure side of the as-measured airfoils. This is quantified as a set of histograms for the airfoil trailing-edge diameter, metal angle, and wedge angle in FIG. 6, FIG. 7 and FIG. 8, respectively. In these figures, each as-measured geometric parameter is binned on the abscissa and the number of occurrences in the population that fall in each bin is counted on the ordinate. The diameter clearly demonstrates non-Gaussian behavior, while the metal angle of FIG. 7 and the wedge angle of FIG. 8 have a more central tendency. However, the wedge angles appear to be slightly bi-modal. These characteristics suggest that the manufacturing process itself deviated in a manner consistent with such a bi-modal distribution.

Descriptive statistics of each trailing-edge geometric parameter in this example are provided in Table 1 below. With the exception of metal angle, the remaining two nominal geometries fell within a single standard deviation from the mean. The nominal metal angle fell within two standard deviations. Thus, it is worth noting that as-measured geometries do not always manifest as the blueprint dimensions.

TABLE 1 statistics of as-measured trailing-edge geometric parameters at the nominal airfoil 50% span

| | As-Measured | | |
|---|---|---|---|
| | Mean | Standard Deviation | Nominal |
| Diameter (mm) | 1.0329 | 0.2064 | 1.1382 |
| Metal Angle (rad) | 1.1207 | 0.0191 | 1.1462 |
| Wedge Angle (rad) | 0.1166 | 0.0361 | 0.1073 |

Continuing with this example, the unsteady analysis that was used will now be discussed.

In this example, a stage-and-one-half transonic turbine was considered with three airfoil rows, where the instantaneous static pressure field was analyzed. The example turbine is characterized by a relatively high Mach number at the blade exit, which gives rise to strong shock waves that emanate from the blade trailing edge and extend downstream. The downstream vane is consistent with a counter-rotating low-pressure turbine stage, and, as such, the vane has very low turning and resembles a flat plate at incidence. In such a situation, the blade trailing-edge shocks are reflected from the downstream vane pressure side and return to the suction side of the blade row in the region downstream of the throat.

In this example, flowfield simulations were conducted using three-row simulations including an inlet guide vane, the rotating blade row, and the downstream stationary vane, where simulations were conducted using the URANS solver described in Ni, R. H., et al., "Aerodynamic Damping Predictions for Oscillating Airfoils in Cascades Using Moving Meshes," ASME Paper No. GT2016-57017 (2016), which is incorporated by reference in its entirety. Each vane was modeled using 1.8×106 nodes, whereas each blade passage included 0.83×106 nodes. The temporal resolution was 200 time steps (with 20 inner iterations in dual-time-step mode) per blade passing and at least ¼ of one revolution to achieve periodic convergence on airfoil passing. Because the blade suction side downstream of the throat was an area of interest, all unsteady calculations to assess the effect of geometric variations on unsteadiness were performed in this example with uncooled airfoils.

In this example, two sets of unsteady flowfield simulations were conducted. In the first instance, the effect of each of the 105 measured airfoil geometries on blade suction-side unsteadiness was considered in isolation. Circumferentially-periodic boundary conditions were employed, so this meant a consideration of 105 different turbine wheels each composed of identical blades. The airfoil counts in the stage-and-one-half turbine were 23/46/23 for the inlet guide vane, the blade, and the downstream vane, respectively. So, each simulation included airfoil passage counts of 1/2/1 in the model. In the second instance, a full-wheel unsteady analysis was conducted with the 46 as-measured blade geometries in their appropriate positions around the turbine disk. For both sets of calculations, the results were compared against those obtained with the blueprint geometry as well as rotating experimental data. All data was ensemble-averaged on the rotation of the wheel for at least 58, but often between 97 and 100 revolutions, and this depended on the experimental run of the transonic turbine facility during which the data from a given sensor was obtained.

Continuing with this example, the results will now be discussed.

Figure 9:
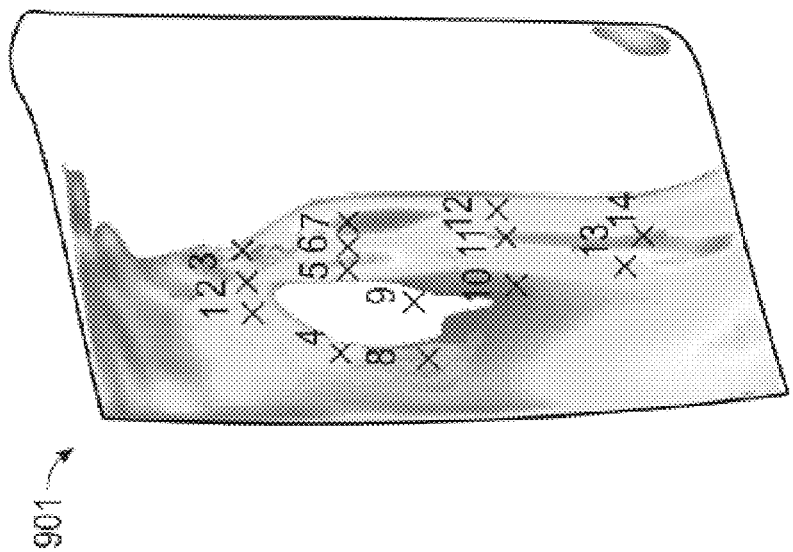
FIG. 9 illustrates unsteady surface pressure magnitude and phase angle, in accordance with a representative embodiment.
Figure 9:
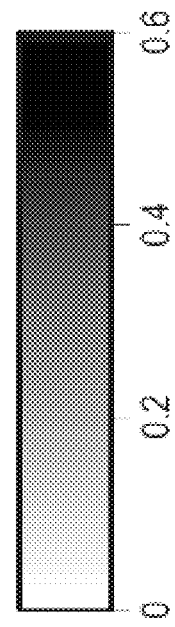
Figure 9:
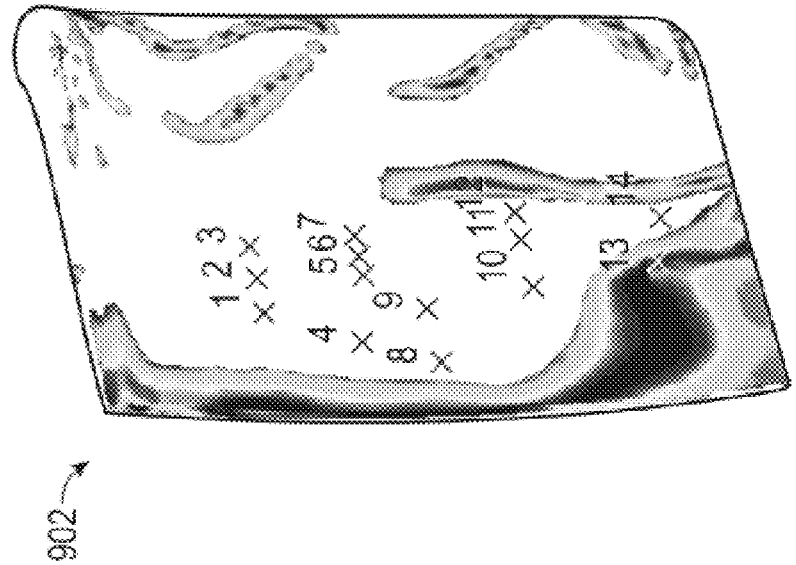
Figure 9:
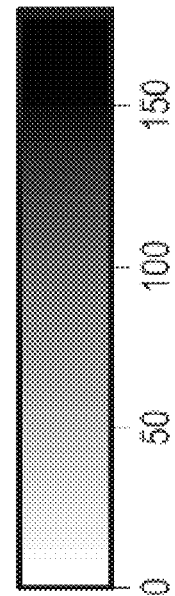

The variation found in blade surface measurements were predicted to result in substantial changes in the predicted level of unsteadiness downstream of the blade throat because that is the area of the blade affected by shock reflections from the downstream vane row. This prediction was confirmed by examining the data presented in FIG. 9. Specifically, FIG. 9 illustrates the standard deviation of unsteady surface pressure magnitude (the first plot 901 on the left side of the figure) as a percent of $P_{tin}$ at 46 E and the phase angle in degrees (the second plot 902 on the right side of the figure). Also shown in FIG. 9 are locations of sensors on the blade suction side downstream of the throat, i.e., designated by the numbers on the blade in the figures.

More specifically, the first plot 901 is a depiction of the blade suction side showing the standard deviation of the difference between the DFT magnitude at twice the downstream vane passing frequency (i.e., 46 E) for the measured blades and that calculated for the blueprint blade. The standard deviation in the pressure magnitude is plotted as a percent of the inlet total pressure to the turbine stage. The second plot 902 shows the standard deviation of the difference in phase angles at the same frequency. As shown in FIG. 9, there is substantial variation in the magnitude and phase of the unsteady pressure in the region downstream of the throat.

In the rotating transonic turbine experiments, there were 14 static-pressure transducers in that region of the blade, and the locations of the sensors are also plotted and numbered on FIG. 9. A spectrogram analysis applied to a sensor (e.g., sensor #7 on FIG. 9) shows a relatively clear distinction between the DFT magnitudes predicted for the blueprint blade versus the as-measured blade placed at its actual location around the wheel in the turbine. Also, the dominant frequency of the interaction is not the fundamental (i.e., 23 E) but the first harmonic of downstream vane passing (46 E). This is a characteristic feature of such shock interactions, and it may be a consequence of the airfoil counts, the airfoil count ratio from row-to-row, and the rotational speed of the turbine blade. Thus, each blade may be impacted by shocks from two neighboring blades per vane passing. When an ensemble-averaged signal sampled on the blade passing period for 58 revolutions is conducted, the spectrogram may give confidence that the unsteady loading is approximately constant from revolution-to-revolution. Accordingly, an ensemble averaged experimental signal may be appropriate for comparison against the various calculations in this study.

Figure 10:
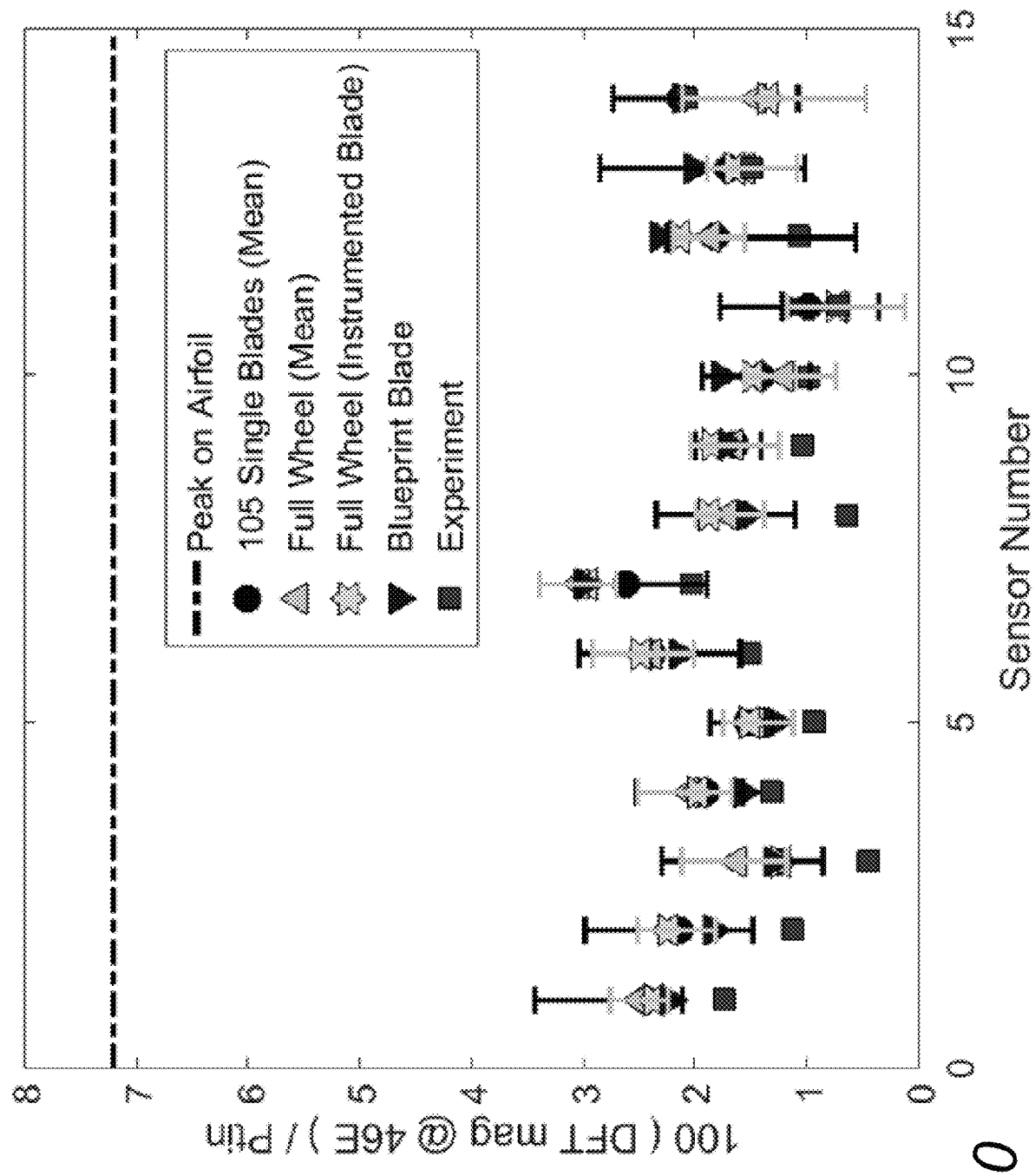
FIG. 10 is a chart showing mean and peak-to-peak variation in calculated Discrete Fourier Transform (DFT) magnitude for sensors found in FIG. 9, in accordance with a representative embodiment.

FIG. 10 is a chart showing mean and peak-to-peak variation in calculated DFT magnitude for the sensors in FIG. 9. In FIG. 10, the variations of DFT magnitude at the sensor locations in FIG. 9 are plotted for simulations along with values calculated for ensemble-averaged experimental data. Also plotted in FIG. 10 is the maximum magnitude at 46 E located anywhere on the blade surface for the blueprint geometry (7.2% of $P_{tin}$). The data from the simulations is plotted as mean levels with peak-to-peak variations given as error bars. Mean levels and variations are plotted for both the 105 single-blade calculations as well as the blade-to-blade variations calculated over the full-wheel simulation. Additionally, data points are plotted from the full-wheel simulation determined at the sensor location for the exact blade that was instrumented in the experiment. It is clear that substantial variations occur at the sensor locations, and these may be significant for any predictions of resonant stress in the design cycle of a turbine. This is because resonant stress typically scales with the magnitude of the forcing at a given frequency and mode of interest. This can be particularly useful if an airfoil is predicted to have a resonant stress that approaches the Goodman limit, as often happens for turbine blades in high-work stages.

In this example, the peak-to-peak variation in DFT magnitudes and mean levels obtained are different for the single-blade calculations versus the full-wheel of as-measured blades. This is because the shock waves reflected off the downstream vane and that return to the blade originate from neighboring rotating airfoils that are two and three passages removed. Also, the blade-to-blade scatter in DFT magnitudes is smaller for the as-built geometry than for the entire 105 airfoils obtained in the casting run. Thus, the calculations obtained for resonant-stress calculations on individual airfoils may utilize modeling of a full wheel of as-measured blades. This finding suggests the possibility that a turbine wheel could be built to have reduced unsteady loading on blades that are expected to have a larger response, as one can derive from a mistuning analysis.

Accordingly, in this example, an attempt to reduce the unsteadiness on a given blade at a specific location was conducted. As seen in FIG. 10, sensor 7 (located on blade 20) was found to have both high predicted and measured levels of unsteadiness at 46 E. Based on the results of flowfield interrogations, it follows that the unsteadiness on blade 20 was likely a consequence of shocks originating from blades 22 and 23. To test this, a 2:4:2 airfoil count simulation was conducted with two upstream vanes, two downstream vanes, and four measured blades consistent with airfoils 20-23, where periodic boundaries were applied at blades 20 and 23. In this example, the resulting distribution of DFT magnitude on blade 20 at 46 E from that simulation is compared to that arising in the full-wheel simulation of measured blades. The findings showed that the unsteady pressure field over blade 20 from the full-wheel simulation is well approximated by that obtained in the simplified 2:4:2 count analysis.

Continuing with this example, the 105 individual-blade unsteady analyses were post-processed to select the three airfoils with the lowest area-averaged signal power at the 23 E and 46 E frequencies over the region on the blade suction-side downstream of the cross-passage shock. Then, the selected blades were substituted for blades 21, 22, and 23 in a 2:4:2 model containing blade 20, and the analysis was repeated. The distribution of the DFT magnitude at 46 E on blade 20 from that analysis was compared to what was obtained in the full-wheel simulation. This showed that the unsteadiness at sensor 7 is substantially reduced as is the distribution of DFT magnitude near the root of the blade. However, there was some increase in the region further outboard of the blade near sensors 4 and 8, so the true efficacy of this change may depend upon the vibratory mode-shape that is of interest. Still, it was quite clear that, in this situation where shock-reflections dominate the unsteady pressure field, it may be possible to tailor the unsteadiness on a blade of interest through judicious selection and placement of measured blades around the wheel.

Blade-to-blade variations in the unsteady flowfield may also be evident in measurements of time-resolved pressures on the downstream vane. When plotting unsteady pressures from experimental data as well as the blueprint- and as-measured blade simulations, blade-to-blade variations in the experimental data may manifest as long scale events that occur throughout an indicated time, which is consistent with a single revolution of the turbine blade at the mean wheel speed and ensemble averaged on the blade rotational period. The same long scale events may occur in the results of the simulation that used measured blades positioned appropriately around the wheel in a manner consistent with experimental data. However, these long-scale variations in the scalogram may be absent from a simulation performed with blueprint blades where each blade is the same as all others.

Further, considering the effect of the measured blades on the predicted level of efficiency, in this example, it was found that for the 105 simulations of single as-measured blades, the calculated delta efficiency with respect to that obtained with the blueprint geometry, Ng, varied from a minimum of −0.4% to a maximum of 0.6% with a standard deviation of 0.2%. The efficiency was taken from the location of the total pressure rake upstream of the first vane to the position of the exit total pressure rake downstream of the second vane. Accordingly, these values are referred to as "rig delta efficiencies." Because the level of variation may be the order of what an aerodynamicist hopes to achieve via design optimization, endwall treatment, or tip clearance desensitization, it may be advisable to include measured geometries in an analysis attempting to determine a benefit of such technologies. In this specific example, the rig delta efficiency was −0.1% relative to the blueprint analysis for the full-wheel simulation with 46 as-measured blades in their appropriate locations around the wheel. This implies that blade-to-blade effects on efficiency may be smeared-out somewhat provided that the overall average blade shape does not differ too markedly from the blueprint intent.

Thus, in the above-referenced example, a series of periodic-unsteady flowfield calculations were performed to assess the effects of as-manufactured blade geometries on predicted unsteady pressures in a stage-and-one-half transonic turbine, where all 105 turbine blades produced in a casting run for the manufacturing of a research turbine stage were measured. Each of the 105 blades was analyzed using an unsteady Reynolds-Averaged Navier-Stokes solver as a single-blade-geometry periodic unsteady calculation. Additionally, measurements of the 46 blades that actually comprised the test turbine were used to create a full-wheel unsteady calculation of the flowfield in the turbine using the same computational boundary conditions. The results of all calculations were then compared to experimental measurements that were reported previously. In this example, it was found that substantial variation in the blade trailing-edge geometry from casting-to-casting produced a range of predicted DFT magnitudes at the frequency associated with trailing-edge shock reflection from downstream vanes. Then, it was shown that it is possible to reduce the unsteadiness in a given region of a specific blade by careful selection of the geometries of the neighboring rotating airfoils that produced the shocks that interacted with the blade. These results may thus demonstrate that there are significant implications for the accurate prediction and control of resonant stresses in turbine components. Based on the findings of this example, a way forward to solve potential resonant stress problems may involve using point cloud data and algorithmic analysis in conjunction with geometric mistuning considerations to help ensure that predicted high-response airfoils are subjected to minimal unsteady loads at frequencies of interest.

Figure 11:
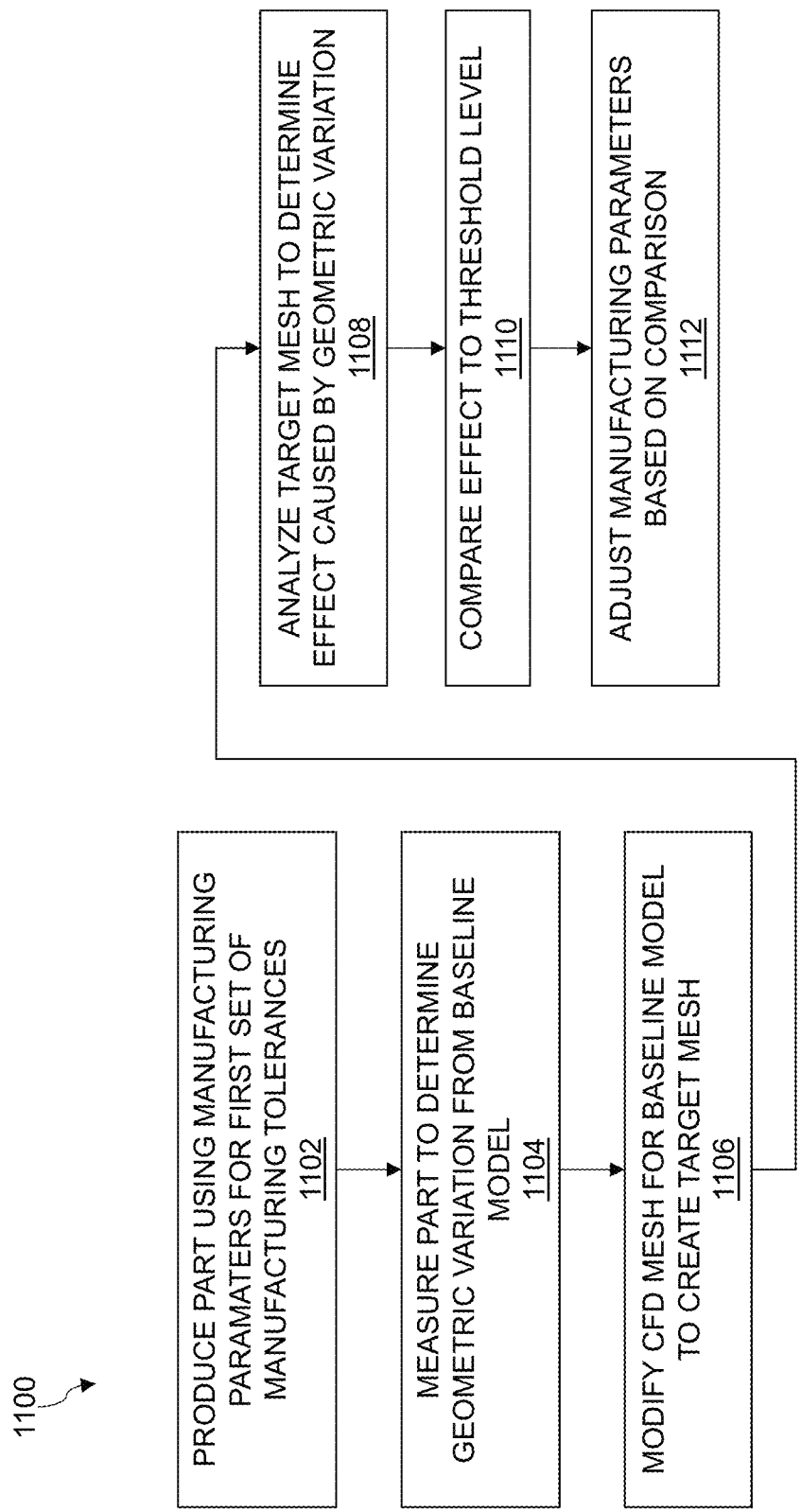
FIG. 11 is a flow chart of a method for designing and manufacturing a physical part, in accordance with a representative embodiment.

Having described an example technique of the present teachings, an alternate method of using the present teachings will now be discussed. In particular, the present teachings may be used for the design and manufacturing of a physical part, e.g., for assisting in determining or adjusting manufacturing tolerances for making a physical part. FIG. 11 is a flow chart of a method 1100 for designing and manufacturing a physical part, in accordance with a representative embodiment.

As shown in block 1102, the method 1100 may include producing a first physical part using a set of first manufacturing parameters based on a first set of manufacturing tolerances. The physical part may be any as described herein, or generally any physical part in which it is desirous to design and manufacture the physical part having certain desired effects (or lack of undesirous effects). Thus, generally, the method 1100 may use one or more of the disclosed techniques to design and manufacture a physical part according to manufacturing techniques (e.g., a specific manufacturing method, or using specific manufacturing or design tolerances) that will achieve a physical part having desired effects or characteristics, e.g., in an overall system containing the physical part. For example, the method 1100 may be used to determine whether less restrictive design and manufacturing tolerances can be used to produce a physical part. The method 1100 may also or instead be used to determine whether more restrictive design and manufacturing tolerances should be implemented, or whether a different overall design or manufacturing process should be used to achieve a physical part with desirous characteristics.

As shown in block 1104, the method 1100 may include measuring one or more surfaces of the first physical part in three-dimensions. The measurement technique may be any as described herein. As further shown in block 1104, the method 1100 may also include analyzing measurements of the first physical part to determine a geometric variation from a baseline model of a physical part. The analysis or comparison of the measurements to the baseline model may include any of the techniques described herein.

As shown in block 1106, the method 1100 may include modifying an existing CFD mesh for the baseline model based on the geometric variation using a mesh metamorphosis algorithm to create a target mesh for the first physical part. This modification of the CFD mesh may include any of the techniques described herein.

As shown in block 1108, the method 1100 may include analyzing the target mesh using a CFD analysis to determine an effect caused by the geometric variation (e.g., an effect on unsteadiness). This analysis may include any of the techniques described herein.

As shown in block 1110, the method 1100 may include comparing the effect (e.g., the effect on unsteadiness) to one or more threshold levels. The threshold level may include a value or result requested by a client, an industry standard, an acceptable practice standard, a regulatory requirement, a design specification, a certification standard, and the like. The threshold level may also or instead include a value in which the physical part provides an acceptable level of performance or a value in which the physical part fails to provide an acceptable level of performance, e.g., a value in which an effect generated by the physical part causes the physical part (or a physical system) to fail or to underperform.

As shown in block 1112, the method 1100 may include adjusting one or more manufacturing parameters based on the comparison of the effect to the threshold level. For example, when an effect on unsteadiness is a predetermined amount below a threshold level of unsteadiness, the method 1100 may include adjusting the set of first manufacturing parameters to a set of second manufacturing parameters based on a second set of manufacturing tolerances more lenient than the first set of manufacturing tolerances. By way of further example, when an effect on unsteadiness is above a threshold level of unsteadiness, the method 1100 may include adjusting the set of first manufacturing parameters to a set of third manufacturing parameters based on a third set of manufacturing tolerances more stringent than the first set of manufacturing tolerances.

In this manner, the method 1100 may provide a technique for determining an actual effect of a manufactured physical part, instead of, or in addition to, simply using baseline data (e.g., blueprint or catalog data). This effect may, in turn, be used to adjust (e.g., fine-tune) a design or manufacturing process, e.g., according to acceptable threshold levels.

The above systems, devices, methods, processes, and the like may be realized in hardware, software, or any combination of these suitable for a particular application. The hardware may include a general-purpose computer and/or dedicated computing device. This includes realization in one or more microprocessors, microcontrollers, embedded microcontrollers, programmable digital signal processors or other programmable devices or processing circuitry, along with internal and/or external memory. This may also, or instead, include one or more application specific integrated circuits, programmable gate arrays, programmable array logic components, or any other device or devices that may be configured to process electronic signals. It will further be appreciated that a realization of the processes or devices described above may include computer-executable code created using a structured programming language such as C, an object oriented programming language such as C++, or any other high-level or low-level programming language (including assembly languages, hardware description languages, and database programming languages and technologies) that may be stored, compiled, or executed to run on one of the above devices, as well as heterogeneous combinations of processors, processor architectures, or combinations of different hardware and software. In another implementation, the methods may be embodied in systems that perform the steps thereof, and may be distributed across devices in a number of ways. At the same time, processing may be distributed across devices such as the various systems described above, or all of the functionality may be integrated into a dedicated, standalone device or other hardware. In another implementation, means for performing the steps associated with the processes described above may include any of the hardware and/or software described above. All such permutations and combinations are intended to fall within the scope of the present disclosure.

Embodiments disclosed herein may include computer program products comprising computer-executable code or computer-usable code that, when executing on one or more computing devices, performs any and/or all of the steps thereof. The code may be stored in a non-transitory fashion in a computer memory, which may be a memory from which the program executes (such as random-access memory associated with a processor), or a storage device such as a disk drive, flash memory or any other optical, electromagnetic, magnetic, infrared or other device or combination of devices. In another implementation, any of the systems and methods described above may be embodied in any suitable transmission or propagation medium carrying computer-executable code and/or any inputs or outputs from same.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So, for example performing the step of X includes any suitable method for causing another party such as a remote user, a remote processing resource (e.g., a server or cloud computer) or a machine to perform the step of X. Similarly, performing steps X, Y, and Z may include any method of directing or controlling any combination of such other individuals or resources to perform steps X, Y, and Z to obtain the benefit of such steps. Thus, method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A method for assembling a physical system with a plurality of physical parts, wherein the physical system includes a turbine and the physical parts include turbine blades, the method, comprising:
- measuring one or more surfaces of the plurality of physical parts in three-dimensions;
- analyzing measurements of each of the plurality of physical parts to determine a geometric variation from a baseline model;
- modifying an existing computational fluid dynamics (CFD) mesh for the baseline model based on the geometric variation using a mesh metamorphosis algorithm to create a target mesh for each of the physical parts;
- analyzing the target mesh using a CFD analysis to determine an effect on unsteadiness in the physical system caused by the geometric variation; and
- wherein when the effect of the unsteadiness causes a stress on the physical system to exceed a predetermined threshold, adjusting an arrangement of the physical system containing the as manufactured physical parts by moving at least two of the plurality of physical parts to different locations in the physical system to reduce the unsteadiness below the predetermined threshold.

2. The method of claim 1, where adjusting the arrangement of the physical system reduces resonant stress in the physical system.

3. The method of claim 1, where modifying the existing CFD mesh comprises iteratively updating the existing CFD mesh using the mesh metamorphosis algorithm to create the target mesh.

4. The method of claim 1, where modifying the existing CFD mesh comprises use of a poi nt-cloud technique.

5. The method of claim 1, where the CFD analysis comprises one or more of a time-domain analysis, a frequency-domain analysis, and an analysis of surface pressure traces.

6. The method of claim 1, where the effect on unsteadiness is based on one or more of surface pressure and shear stress experienced by the target mesh in the CFD analysis.

7. The method of claim 1, where the CFD analysis comprises use of a CFD solver having an output comprising one or more of time-varying pressure and shear stress on the physical part.

8. The method of claim 1, where measuring the one or more surfaces of the plurality of physical parts comprises use of an optical scanner.

9. The method of claim 8, where measuring the one or more surfaces of the plurality of physical parts comprises use of a structured light optical measurement system.

10. The method of claim 1, where measuring the one or more surfaces of the plurality of physical parts comprises use of a coordinate measurement machine (CMM).

11. The method of claim 1, where the baseline model corresponds to at least one of a manufacturer specification for at least one of the plurality of physical parts and a second physical part.

12. An apparatus defined by a physical system that includes a turbine and a plurality of physical parts that includes turbine blades, the apparatus comprising:
- the plurality of physical parts arranged in a predetermined manner based on an unsteadiness effect corresponding to at least one physical part of the plurality of physical parts, the unsteadiness effect for the at least one physical part established by:
- measuring one or more surfaces of the at least one physical part in three-dimensions;
- analyzing measurements of the at least one physical part to determine a geometric variation from a baseline model;
- modifying an existing computational fluid dynamics (CFD) mesh for the baseline model based on the geometric variation using a mesh metamorphosis algorithm to create a target mesh for the at least one physical part; and
- analyzing the target mesh using a CFD analysis to determine the unsteadiness effect caused by the geometric variation;
- where the arrangement of the plurality of physical parts in the predetermined manner comprises a predetermined positioning about a turbine wheel for each of the turbine blades; and
- where one or more of the turbine blades are physically moved to different locations about the turbine wheel after an initial assembly in response to the determined unsteadiness effect to reduce the unsteadiness effect.

13. The apparatus of claim 12, where the arrangement of the plurality of physical parts in the predetermined manner is based on an unsteadiness effect for each physical part in the plurality of physical parts.

14. A method for assembling a physical system with a plurality of physical parts, wherein the physical system includes a turbine and the physical parts include turbine blades, the method, comprising:
- producing a first physical part of the plurality of physical parts using a set of first manufacturing parameters based on a first set of manufacturing tolerances;
- measuring one or more surfaces of the first physical part in three-dimensions;
- analyzing measurements of the first physical part to determine a geometric variation from a baseline model of the physical part;
- modifying an existing computational fluid dynamics (CFD) mesh for the baseline model based on the geometric variation using a mesh metamorphosis algorithm to create a target mesh for the first physical part;
- analyzing the target mesh using a CFD analysis to determine an effect on unsteadiness caused by the geometric variation;
- comparing the effect on unsteadiness to one or more threshold levels of unsteadiness;
- when the effect on unsteadiness is a predetermined amount below the one or more threshold levels of unsteadiness, adjusting the set of first manufacturing parameters to a set of second manufacturing parameters based on a second set of manufacturing tolerances more lenient than the first set of manufacturing tolerances;
- manufacturing a plurality of physical parts that meet the second set of manufacturing tolerances, and
- assembling the manufactured plurality of physical parts in such a manner that the physical system operates below the one or more threshold levels of unsteadiness.

15. The method of claim 14, further comprising, when the effect on unsteadiness is above the one or more threshold levels of unsteadiness, adjusting the set of first manufacturing parameters to a set of third manufacturing parameters based on a third set of manufacturing tolerances more stringent than the first set of manufacturing tolerances, and manufacturing a plurality of physical parts that meet the third set of manufacturing tolerances.

* * * * *